United States Patent
Lai et al.

(10) Patent No.: US 12,256,644 B2
(45) Date of Patent: Mar. 18, 2025

(54) MAGNETORESISTIVE SENSOR AND MANUFACTURING METHOD THEREOF

(71) Applicant: National Tsing Hua University, Hsinchu (TW)

(72) Inventors: Chih-Huang Lai, Hsinchu (TW); Chia-Chang Lee, Hsinchu (TW); Yu-Shen Yen, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 525 days.

(21) Appl. No.: 17/580,645

(22) Filed: Jan. 21, 2022

(65) Prior Publication Data
US 2023/0176149 A1    Jun. 8, 2023

(30) Foreign Application Priority Data

Dec. 7, 2021   (TW) ................................. 110145567

(51) Int. Cl.
*H10N 50/01* (2023.01)
*G01R 33/09* (2006.01)
(Continued)

(52) U.S. Cl.
CPC ............ *H10N 50/01* (2023.02); *G01R 33/093* (2013.01); *H01F 10/3272* (2013.01); *H10N 50/10* (2023.02)

(58) Field of Classification Search
None
See application file for complete search history.

(56) References Cited

U.S. PATENT DOCUMENTS

2005/0164414 A1*  7/2005  Deak ..................... B82Y 25/00
                                                      257/E43.006
2006/0023492 A1   2/2006  Min et al.
(Continued)

FOREIGN PATENT DOCUMENTS

CN           102812367         12/2012

OTHER PUBLICATIONS

Cheng-Kai Huang, "Size Effects on Exchange Bias Coupling in Patterned Co/CoO Bilayers", Master's Thesis, Department of Electrophysics, Nation Chiao Tung University, Aug. 2014, with English abstract, pp. 1-76.
(Continued)

*Primary Examiner* — Feifei Yeung Lopez
(74) *Attorney, Agent, or Firm* — JCIPRNET

(57) ABSTRACT

A magnetoresistive sensor and a manufacturing method thereof are provided. The method includes: forming an initial reference layer in an annular shape, wherein the initial reference layer includes an anti-ferromagnetic layer and a ferromagnetic layer; performing a heat treatment on the initial reference layer, wherein the ferromagnetic layer is magnetized to have a magnetization direction oriented along a vortex path during a heating step of the heat treatment, and an exchange bias oriented along the vortex path is induced at an interface of the anti-ferromagnetic layer and the ferromagnetic layer during a cooling step of the heat treatment; patterning the initial reference layer to form separated reference layers, wherein the reference layers are respectively formed in a annular sector shape, and the reference layers are arranged along the vortex path; forming spacer layers and free layers to form magnetoresistive devices; routing the magnetoresistive devices to form the magnetoresistive sensor.

5 Claims, 15 Drawing Sheets

(51) Int. Cl.
*H01F 10/32* (2006.01)
*H10N 50/10* (2023.01)

(56) References Cited

U.S. PATENT DOCUMENTS

| | | | |
|---|---|---|---|
| 2007/0236212 A1 | 10/2007 | Tondra | |
| 2009/0015252 A1* | 1/2009 | Raberg | B82Y 25/00 |
| | | | 324/252 |
| 2010/0232215 A1* | 9/2010 | Min | H10N 50/10 |
| | | | 365/158 |
| 2012/0326703 A1* | 12/2012 | Hayashi | G01R 33/093 |
| | | | 324/126 |
| 2014/0320117 A1 | 10/2014 | Meguro et al. | |

OTHER PUBLICATIONS

"Office Action of Taiwan Counterpart Application", issued on Mar. 22, 2023, p. 1-p. 4.

J. Cao et al., "Wheatstone bridge sensor composed of linear MgO magnetic tunnel junctions," Journal of Applied Physics, Apr. 2010, pp. 1-4.

Paulo P. Freitas et al., "Spintronic Sensors," Proceedings of the IEEE, vol. 104, Oct. 2016, pp. 1894-1918.

María Dolores Cubells-Beltran et al., "Full Wheatstone Bridge Spin-Valve Based Sensors for IC Currents Monitoring," IEEE Sensors Journal, vol. 9, Dec. 2009, pp. 1756-1762.

Van Su Luong et al., "Planarization, Fabrication, and Characterization of Three-Dimensional Magnetic Field Sensors," IEEE Transactions on Nanotechnology, vol. 17, Jan. 2018, pp. 11-25.

\* cited by examiner

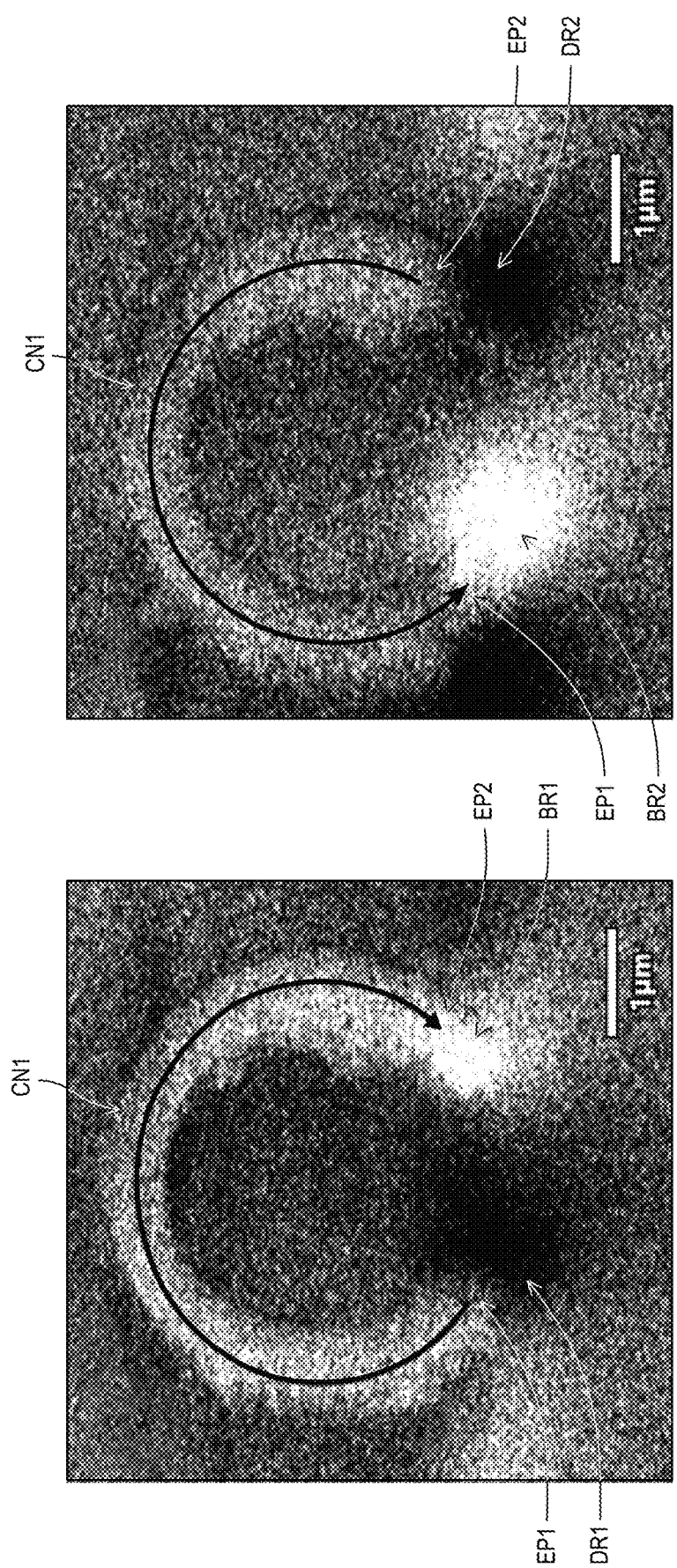

MAGNETORESISTIVE SENSOR AND MANUFACTURING METHOD THEREOF

CROSS-REFERENCE TO RELATED APPLICATION

This application claims the priority benefit of Taiwan application serial no. 110145567, filed on Dec. 7, 2021. The entirety of the above-mentioned patent application is hereby incorporated by reference herein and made a part of this specification.

BACKGROUND

Technical Field

The present disclosure relates to a magnetic sensor and a manufacturing method thereof, and particularly, to a magnetoresistive sensor and manufacturing method thereof.

Description of Related Art

Along with development of Internet of Things (IoT) and Industry 4.0, demands for various sensors is increased. Magnetoresistive sensor has advantages including low power consumption, low cost, and insusceptibility to ambient conditions, thus gradually takes place of optical sensor in many applications. As examples, the magnetoresistive sensor may include a magnetoresistive sensor having anisotropic magnetoresistive (AMR) devices, a magnetoresistive sensor having giant magnetoresistive (GMR) devices or a magnetoresistive sensor having tunneling magnetoresistive (TMR) devices.

However, is has been struggling to massively manufacture magnetoresistive sensor having magnetoresistive devices with different phases by a simple process. To be more specific, a reference direction of a GMR device or a TMR device is determined by a magnetization direction of a reference layer in the GMR/TMR device, and such magnetization direction is decided by a magnetic field applied in a field cooling step during manufacturing. Only the GMR/TMR devices with identical magnetization direction can be fabricated during a single manufacturing process. Additional process steps may be required to form GMR/TMR devices with different reference directions. Consequently, cost and complexity for manufacturing the magnetoresistive sensor are significantly increased.

SUMMARY

In an aspect of the present disclosure, a manufacturing method of a magnetoresistive sensor is provided. The method comprises: forming an initial reference layer in an annular shape, wherein the initial reference layer includes an antiferromagnetic layer and a ferromagnetic layer in contact with each other; subjecting the initial reference layer to a heat treatment, wherein the ferromagnetic layer is magnetized and has a magnetization direction oriented along a vortex path during a heating step of the heat treatment, and an exchange bias oriented along the vortex path is generated at an interface between the antiferromagnetic layer and the ferromagnetic layer during a cooling step of the heat treatment; patterning the initial reference layer to form separate reference layers, wherein the reference layers are respectively in an annular sector shape, and the reference layers are arranged along the vortex path; forming spacer layers and free layers, to form magnetoresistive devices, wherein the magnetoresistive devices respectively comprise one of the reference layers and one of the free layers separated from each other by one of the spacer layers; and routing the magnetoresistive device to form the magnetoresistive sensor.

In some embodiments, the initial reference layer is formed as a closed annulus pattern.

In some embodiments, the initial reference layer is formed as an open annulus pattern.

In some embodiments, the initial reference layer is formed as a circular annulus pattern or a polygonal annulus pattern.

In some embodiments, the initial reference layer is not applied with an external magnetic field during the cooling step of the heat treatment.

In some embodiments, an external magnetic field is applied to the initial reference layer during the cooling step of the heat treatment.

In some embodiments, different exchange biases of the reference layers follow the vortex path.

In some embodiments, the spacer layers and the free layers are formed after formation of the reference layers.

In some embodiments, the spacer layers and the free layers are formed before formation of the reference layers.

In another aspect of the present disclosure, a magnetoresistive sensor is provided. The magnetoresistive sensor comprises: a first magnetoresistive device and a second magnetoresistive device, having an exchange bias oriented along a first direction; and a third magnetoresistive device and a fourth magnetoresistive device, having an exchange bias oriented along a second direction, wherein the first and third magnetoresistive devices are serially connected, the second and fourth magnetoresistive devices are serially connected, the serially connected first and third magnetoresistive devices and the serially connected second and fourth magnetoresistive devices are connected in parallel, and each of the first magnetoresistive device, the second magnetoresistive device, the third magnetoresistive device and the fourth magnetoresistive device is formed in an annular sector shape.

In some embodiments, the first magnetoresistive device and the second magnetoresistive device have a first phase with respect to an external magnetic field, and the third magnetoresistive device and the fourth magnetoresistive device have a second phase with respect to the external magnetic field.

In some embodiments, the first phase is different from the second phase by about 180°.

In some embodiments, the first magnetoresistive device, the second magnetoresistive device, the third magnetoresistive device and the fourth magnetoresistive device respectively comprise a reference layer, a free layer and a spacer layer lying between the reference layer and the free layer.

In some embodiments, the first magnetoresistive device, the second magnetoresistive device, the third magnetoresistive device and the fourth magnetoresistive device are respectively a giant magnetoresistive (GMR) spin valve, and the spacer layer is formed of a non-magnetic conductive material.

In some embodiments, the first magnetoresistive device, the second magnetoresistive device, the third magnetoresistive device and the fourth magnetoresistive device are respectively a tunneling magnetoresistive (TMR) spin valve, and the spacer layer is formed of an insulating material.

In some embodiments, the first magnetoresistive device, the second magnetoresistive device, the third magnetoresistive device and the fourth magnetoresistive device respectively have a curved shape.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 5C and FIG. 5D are images taken on the test structure shown in FIG. 5A by a magnetic force microscopy (MFM).

DESCRIPTION OF THE EMBODIMENTS

The magnetoresistive sensor described in the present disclosure includes a combination of magnetoresistive devices having different phases. As an example, the magnetoresistive sensor described herein may include at least one wheatstone bridge. Magnetoresistive devices in the wheatstone bridge are connected with one another and have different phases. Electrical resistances of the magnetoresistive devices may vary in corresponding to variation of external magnetic field, thus an output terminal of the wheatstone bridge can be altered.

Figure 1A:
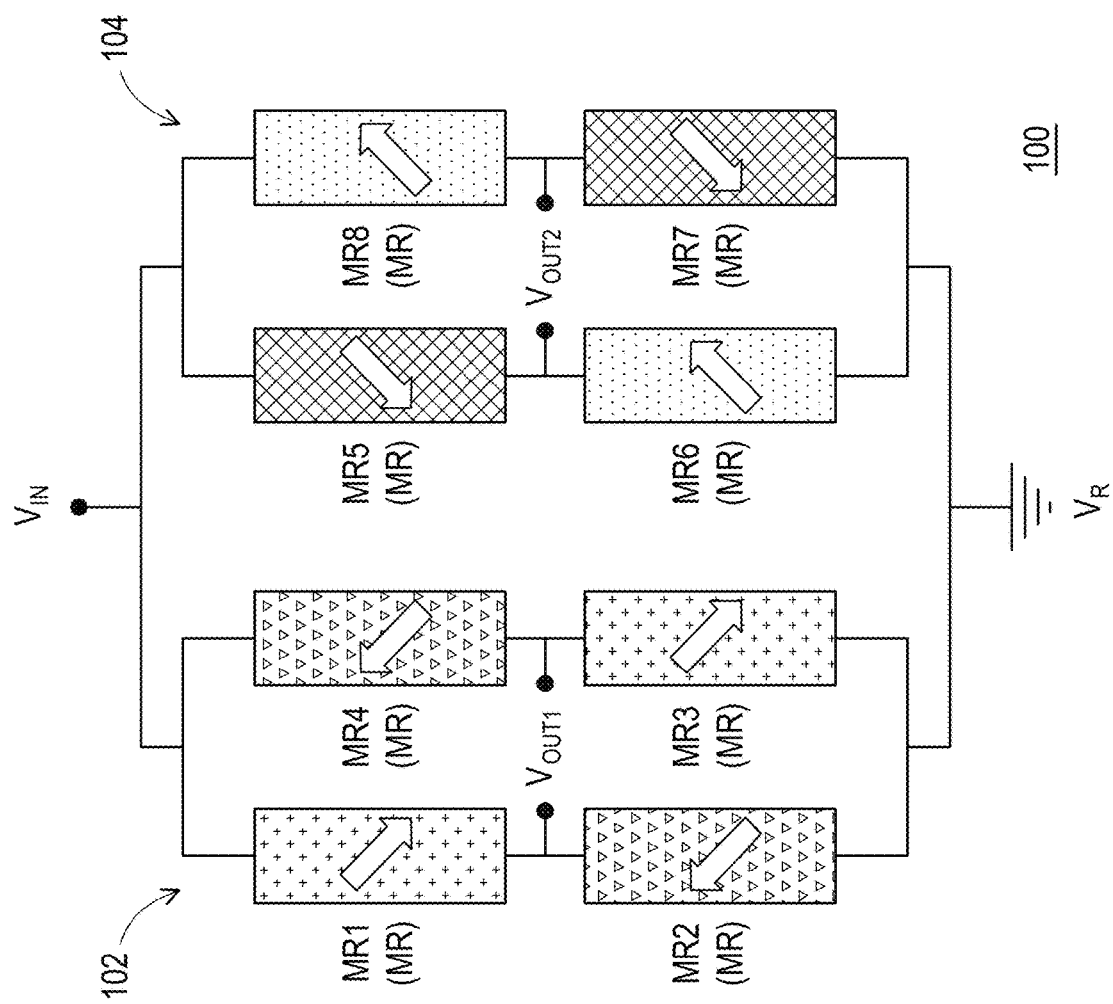
FIG. 1A is a schematic diagram illustrating a magnetoresistive sensor, according to some embodiments of the present disclosure.

FIG. 1A is a schematic diagram illustrating a magnetoresistive sensor 100, according to some embodiments of the present disclosure.

Referring to FIG. 1A, the magnetoresistive sensor 100 includes a wheatstone bridge 102 and a wheatstone bridge 104. As will be further described, the wheatstone bridge 102 and the wheatstone bridge 104 respectively include multiple magnetoresistive devices MR having different phases, and the magnetoresistive devices MR of the wheatstone bridge 102 have phase differences with respect to the magnetoresistive devices MR of the wheatstone bridge 104. It should be noted that, the phase of each magnetoresistive device MR indicates a relationship between resistance variation of the magnetoresistive device MR with respect to variation of an external magnetic field, and such relationship is dependent on a magnetization direction of its reference layer (as indicated by the arrow in each magnetoresistive device MR in FIG. 1A). In other words, the phase of each magnetoresistive device MR is related to the magnetization direction of its reference layer. When two magnetoresistive devices MR are described as having a phase difference with each other in the present disclosure, the reference layers of these magnetoresistive devices MR have different magnetization directions.

In some embodiments, the wheatstone bridge 102 is a full bridge. In these embodiments, the wheatstone bridge 102 includes four magnetoresistive devices MR each having an electrical resistance varying with respect to variation of the external magnetic field. The four magnetoresistive devices MR include a magnetoresistive device MR1, a magnetoresistive device MR2, a magnetoresistive device MR3 and a magnetoresistive device MR4. The magnetoresistive devices MR1, MR2 are in serial connection, and have a phase difference of about 180° with each other (i.e., the magnetization directions of the reference layers in the magnetoresistive devices MR1, MR2 are about 180° different from each other). Similarly, the magnetoresistive devices MR3, MR4 are in serial connection as well, and also have a phase difference of about 180° with each other (i.e., the magnetization directions of the reference layers in the magnetoresistive devices MR3, MR4 are about 180° different from each other). Accordingly, two of the magnetoresistive devices MR1-MR4 may have a phase, while the other two of the magnetoresistive devices MR1-MR4 may have another phase. For instance, the magnetoresistive device MR1 and the magnetoresistive device MR3 have a first phase, while the magnetoresistive device MR2 and the magnetoresistive device MR4 have a second phase different from the first phase by about 180°.

Further, the serially connected magnetoresistive devices MR1, MR2 and the serially connected magnetoresistive devices MR3, MR4 are connected in parallel between an input terminal $V_{IN}$ and a reference voltage terminal $V_R$. In addition, an output terminal $V_{OUT1}$ of the wheatstone bridge 102 is connected to a node between the serially connected magnetoresistive devices MR1, MR2 and a node between the serially connected magnetoresistive devices MR3, MR4. In some embodiments, the magnetoresistive devices MR1, MR4 with a phase difference of about 180° are connected between the input terminal $V_{IN}$ and the output terminal $V_{OUT1}$, whereas the magnetoresistive devices MR2, MR3 with a phase difference of about 180° are connected between the reference voltage terminal $V_R$ and the output terminal $V_{OUT1}$.

Similarly, in some embodiments, the wheatstone bridge 104 is a full bridge as well. In these embodiments, the wheatstone bridge 104 includes four magnetoresistive devices MR each having an electrical resistance varying with respect to variation of the external magnetic field. The four magnetoresistive devices MR include a magnetoresistive device MR5, a magnetoresistive device MR6, a magnetoresistive device MR7 and a magnetoresistive device MR8. The magnetoresistive devices MR5, MR6 are in serial connection, and have a phase difference of about 180° with each other (i.e., the magnetization directions of the reference layers in the magnetoresistive devices MR5, MR6 are about 180° different from each other). Similarly, the magnetoresistive devices MR7, MR8 are in serial connection as well, and also have a phase difference of about 180° with each other (i.e., the magnetization directions of the reference layers in the magnetoresistive devices MR7, MR8 are about 180° different from each other). Accordingly, two of the magnetoresistive devices MR5-MR8 may have a phase, while the other two of the magnetoresistive devices MR5-MR8 may have another phase. Moreover, as described above, the magnetoresistive devices MR5-MR8 of the wheatstone bridge 104 have a phase difference (e.g., a phase difference of about 90°) with respect to the magnetoresistive devices MR1-MR4 of the wheatstone bridge 102, respectively. For instance, the magnetoresistive devices MR5, MR7 have a third phase, which is different from the first and second phases of the magnetoresistive devices MR1, MR3 and the magnetoresistive devices MR2, MR4 in the wheatstone bridge 102 by about 90°, respectively. In addition, the magnetoresistive devices MR6, MR8 of the wheatstone bridge 104 have a fourth phase different from the third phase by about 180°, and different from the first and second phases of the magnetoresistive devices MR1, MR3 and the magnetoresistive devices MR2, MR4 in the wheatstone bridge 102 by about 90°, respectively.

In some embodiments, the wheatstone bridges 102, 104 are connected in parallel between the input terminal $V_{IN}$ and the reference voltage terminal $V_R$. In these embodiments, the serially connected magnetoresistive devices MR5, MR6 and the serially connected magnetoresistive devices MR7, MR8 may be connected in parallel between the input terminal $V_{IN}$ and the reference voltage terminal $V_R$ shared with the wheatstone bridge 102. In addition, an output terminal $V_{OUT2}$ of the wheatstone bridge 104 is connected to a node between the serially connected magnetoresistive devices MR5, MR6 and a node between the serially connected magnetoresistive devices MR7, MR8. In some embodiments, the magnetoresistive devices MR5, MR8 with a phase difference of about 180° are connected between the input terminal $V_{IN}$ and the output terminal $V_{OUT2}$, whereas the magnetoresistive devices MR6, MR7 with a phase difference of about 180° are connected between the reference voltage terminal $V_R$ and the output terminal $V_{OUT2}$.

Figure 1B:
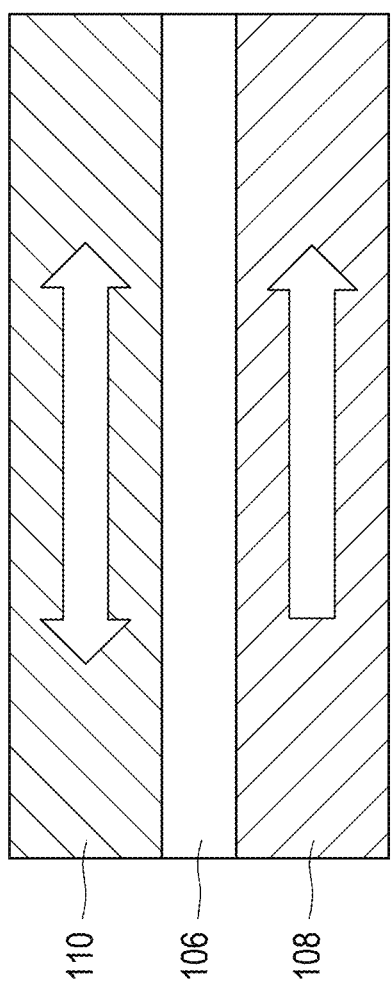
FIG. 1B is a schematic cross-sectional view illustrating a basic structure of each magnetoresistive device in the magnetoresistive sensor shown in FIG. 1A.

FIG. 1B is a schematic cross-sectional view illustrating a basic structure of each magnetoresistive device MR in the magnetoresistive sensor 100 shown in FIG. 1A.

Referring to FIG. 1B, each magnetoresistive device MR may be a spin valve, and includes a spacer layer 106, a reference layer 108 and a free layer 110 separated from the reference layer 108 by the spacer layer 106. The reference layer 108 and the free layer 110 each include a ferromagnetic material. As compared to the free layer 110, the reference layer 108 may be configured to have a greater coercivity, such that a magnetization direction of the reference layer 108 is less likely to be altered in corresponding to variation of the external magnetic field, and is indicated by a unidirectional arrow shown in FIG. 1B. On the other hand, the free layer 110 has a relatively low coercivity, and a magnetization direction of the free layer 110 is dependent on variation of the external magnetic field, as indicated by a bi-directional arrow shown in FIG. 1B. An angle between the magnetization direction of the reference layer 108 and the magnetization direction of the free layer 110 (i.e., a direction of the external magnetic field) determines an electrical resistance across the magnetoresistive device MR. For instance, when the magnetization direction of the reference layer 108 is aligned with the magnetization direction of the free layer 110, the magnetoresistive device MR is in a parallel state, and has a low electrical resistance. On the other hand, when the magnetization direction of the reference layer 108 is opposite to the magnetization direction of the free layer 110, the magnetoresistive device MR is in an anti-parallel state, and has a high electrical resistance. As a result that the electrical resistances of the magnetoresistive devices MR change in corresponding to the external magnetic field, each wheatstone bridge 102/104 outputs different voltages in corresponding to variation (e.g., magnitude, direction . . . etc.) of the external magnetic field.

In some embodiments, the magnetoresistive device MR is a giant magnetoresistive (GMR) spin valve. In these embodiments, the spacer layer 106 may be formed by a non-magnetic conductive material. For instance, the non-magnetic conductive material may include Cu, Ag, Cr, other non-magnetic metals or alloys formed of combinations of these non-magnetic metals. In alternative embodiments, the magnetoresistive device MR is a tunneling magnetoresistive (TMR) spin valve. In these alternative embodiments, the spacer layer 106 may be formed of an insulating material. For instance, the insulating material may include magnesium oxide, aluminum oxide, other insulating materials or combinations thereof.

The reference layer 108, the spacer layer 106 and the free layer 110 may stack along a vertical direction, to form a stacking structure. According to some embodiments, as shown in FIG. 1B, the reference layer 108 lies below the spacer layer 106, while the free layer 110 is located above the spacer layer 106. However, in alternative embodiments, the reference layer 108 may be located above the spacer layer 106, whereas the free layer 110 may lie under the spacer layer 106.

Figure 1C:
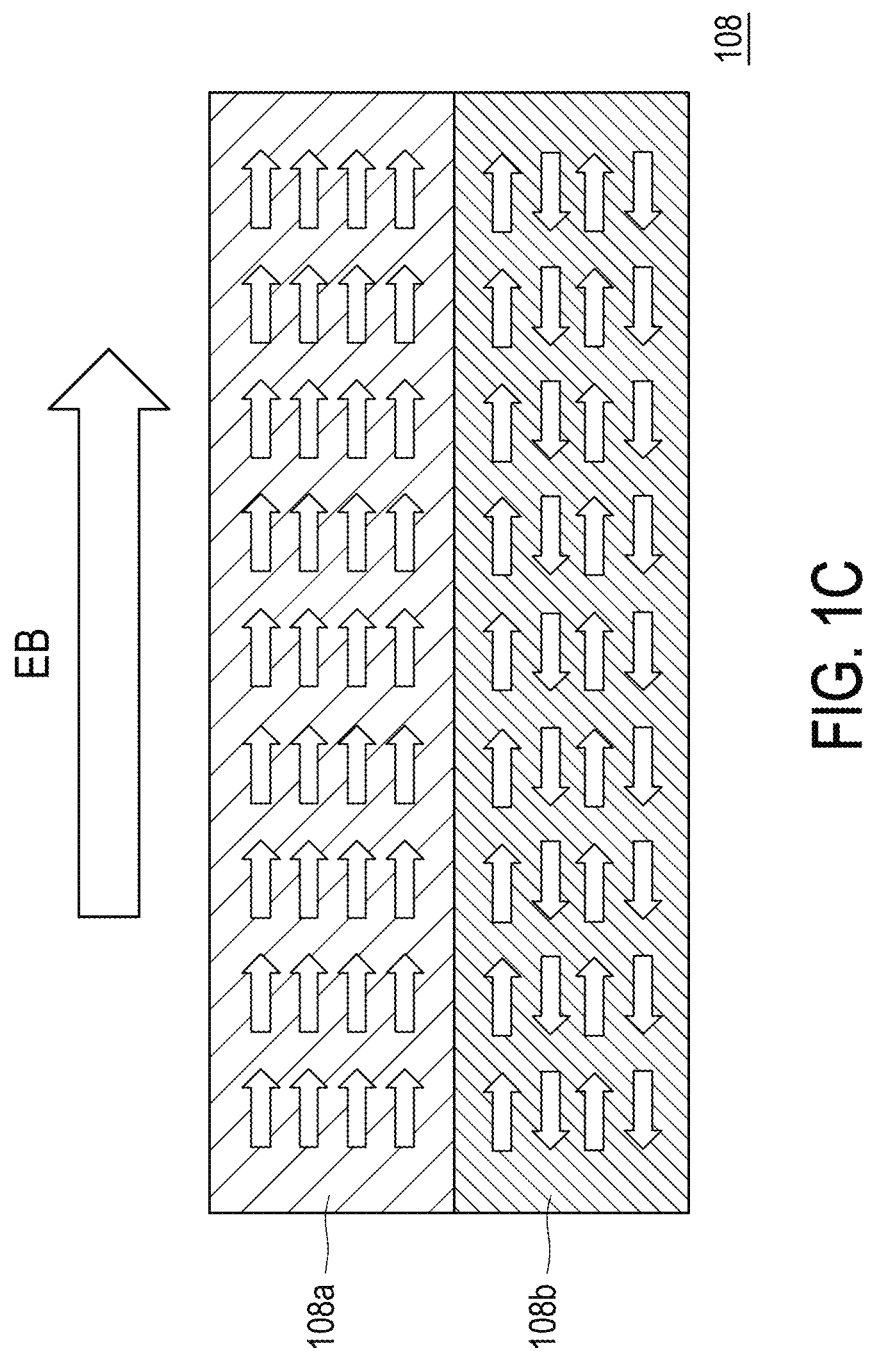
FIG. 1C is a schematic cross-sectional view illustrating a detailed structure of a reference layer, according to some embodiments of the present disclosure.

FIG. 1C is a schematic cross-sectional view illustrating a detailed structure of a reference layer 108, according to some embodiments of the present disclosure.

Referring to FIG. 1C, in some embodiments, the reference layer 108 is a multilayer structure, which includes a ferromagnetic layer 108a and an antiferromagnetic layer 108b. Due to an exchange bias coupling effect at an interface between the ferromagnetic layer 108a and the antiferromagnetic layer 108b, a magnetic hysteresis loop of the ferromagnetic layer 108a shifts, such that the ferromagnetic layer 108a has a greater coercivity. Accordingly, spin directions in the ferromagnetic layer 108a may be described as being pinned to a certain direction (as indicated by multiple arrows in the ferromagnetic layer 108a shown in FIG. 1C), which is also referred to as an exchange bias coupling direction EB. The exchange bias coupling direction EB determines the magnetization direction of the reference layer 108, and defines the phase of the magnetoresistive device MR. On the other hand, as indicated by multiple arrows in the antiferromagnetic layer 108b shown in FIG. 1C, spin directions in a thin region of the antiferromagnetic layer 108b closest to the ferromagnetic layer 108a may be aligned with the exchange bias coupling EB direction, and spin directions in rest portion of the antiferromagnetic layer 108b may be alternately oriented as opposite directions along a direction away from the ferromagnetic layer 108a, in order to maintain antiferromagnetic characteristic. In some embodiments, the ferromagnetic material for forming the ferromagnetic layer 108a includes a Ni—Fe alloy, a Co—Fe—B alloy, a Co—Fe alloy, Co or other ferromagnetic metals, metal alloys or metallic compounds, while the antiferromagnetic material for forming the antiferromagnetic layer 108b includes an Ir—Mn alloy, a Pt—Mn alloy or the like.

Figure 1D:
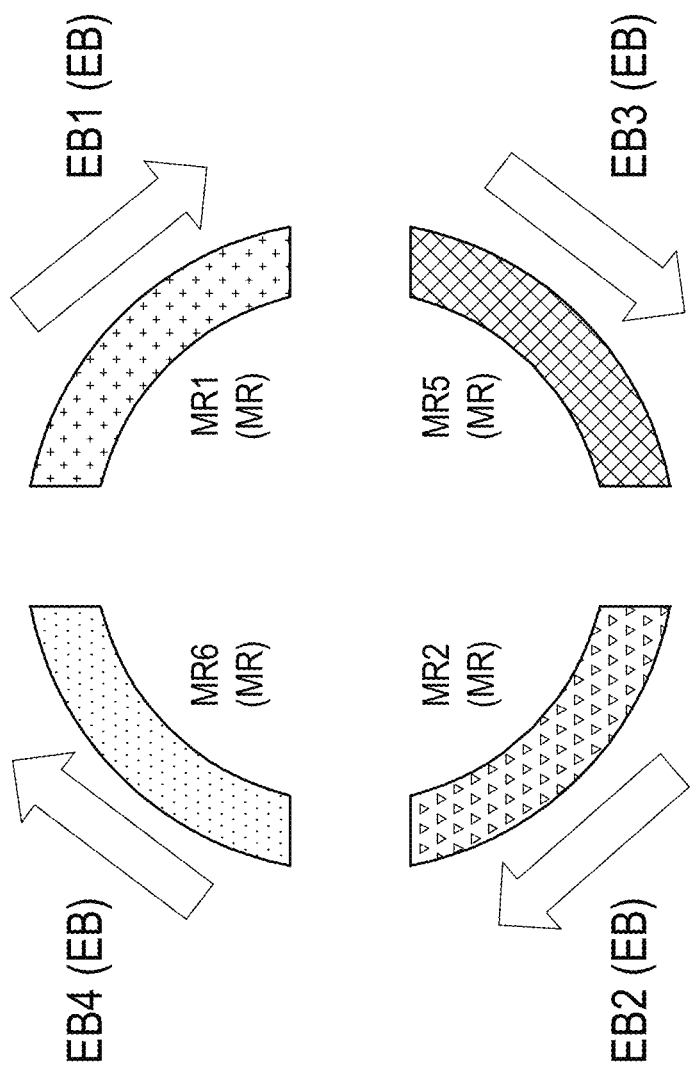
FIG. 1D is a schematic plan view illustrating magnetoresistive devices with different phases, according to some embodiments of the present disclosure.

FIG. 1D is a schematic plan view illustrating magnetoresistive devices MR with different phases, according to some embodiments of the present disclosure.

Referring to FIG. 1D, each magnetoresistive device MR may be formed in an annular sector shape. The reference layers 108 of the magnetoresistive devices MR with different phases may be separate annular sector portions singulated from a single initial reference layer formed in an annular shape. This initial reference layer in annular shape may have an exchange bias coupling direction following a vortex path or a loop. Accordingly, when the annular sector portions of the annular initial reference layer are singulated, these reference layers 108 in annular sector shapes have different exchange bias coupling directions along the vortex path or loop of the original exchange bias coupling direction. Therefore, the magnetoresistive devices MR including these reference layers 108 may have various phases.

For instance, the reference layers of the magnetoresistive device MR1 with the first phase, the magnetoresistive device MR2 with the second phase, the magnetoresistive device MR5 with the third phase and the magnetoresistive device MR6 with the fourth phase may be formed by singulating four separate annular sector portions from a single initial reference layer in annular shape, and are arranged along a vortex path or a loop. The first phase of the magnetoresistive device MR1 is indicated by a first exchange bias coupling direction EB1; the second phase of the magnetoresistive device MR2 is indicated by a second exchange bias coupling direction EB2; the third phase of the magnetoresistive device MR5 is indicated by a third exchange bias coupling direction EB3; and the fourth phase of the magnetoresistive device MR6 is indicated by a fourth exchange bias coupling direction EB4. In some embodiments, as shown in FIG. 1D, the first exchange bias coupling direction EB1, the third exchange bias coupling direction EB3, the second exchange bias coupling direction EB2 and the fourth exchange bias coupling direction EB4 are arranged along a clockwise path. In alternative embodiments, the first through fourth exchange bias coupling directions EB1-EB4 are arranged along a counterclockwise path.

Although not shown, the magnetoresistive device MR3 with the first phase, the magnetoresistive device MR4 with the second phase, the magnetoresistive device MR7 with the third phase and the magnetoresistive device MR8 with the fourth phase may also be formed by singulating four separate annular sector portions from a single initial reference layer in annular shape, and are arranged along a vortex path or a loop as well. In addition, the exchange bias coupling directions of these magnetoresistive devices MR may be arranged along a clockwise path. Alternatively, the exchange bias coupling directions of these magnetoresistive devices MR may be arranged along a counterclockwise path.

Figure 2:
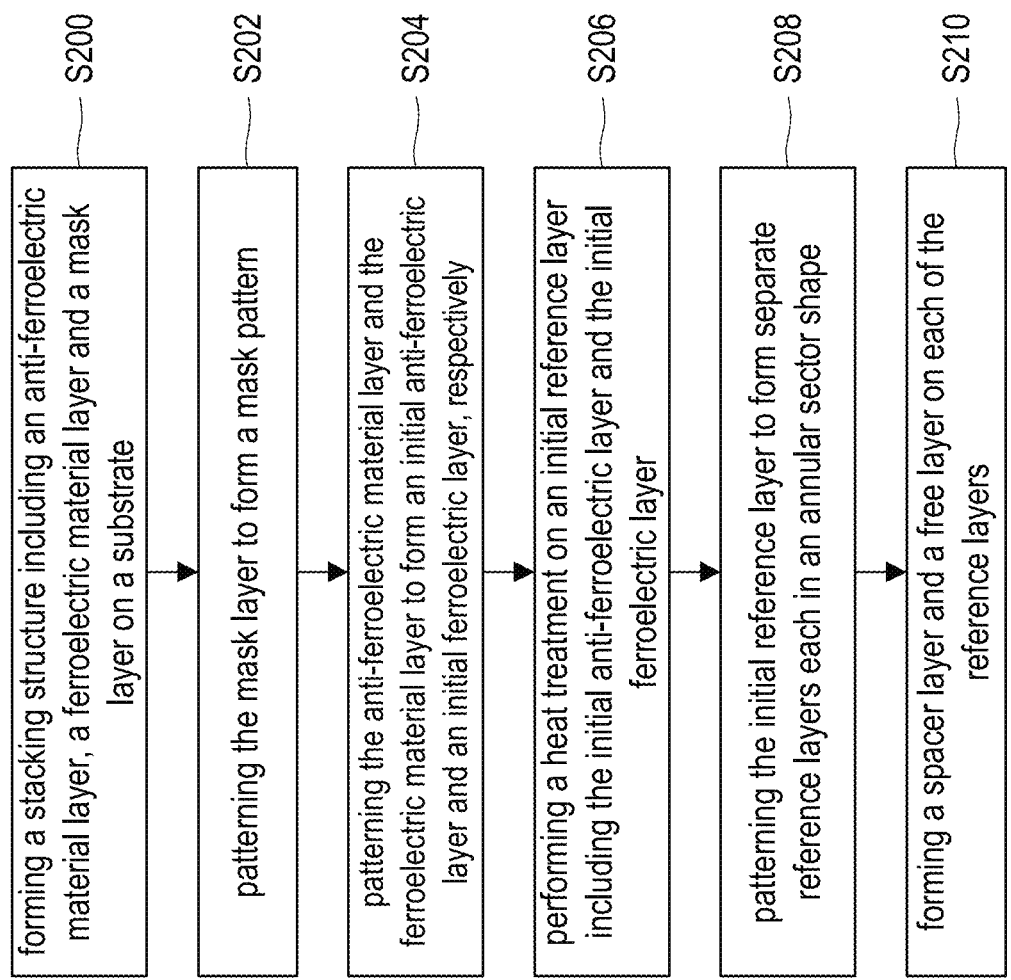
FIG. 2 is a flow diagram illustrating a method for manufacturing the magnetoresistive devise with different phases, according to some embodiments of the present disclosure.

FIG. 2 is a flow diagram illustrating a method for manufacturing the magnetoresistive devise MR with different phases, according to some embodiments of the present disclosure. FIG. 3A through FIG. 3F are schematic plan views illustrating intermediate structures at various stages during the manufacturing process shown in FIG. 2. FIG. 4A through FIG. 4F are schematic cross-sectional views illustrating the intermediate structures at various stages during the manufacturing process shown in FIG. 2.

Figure 4A:
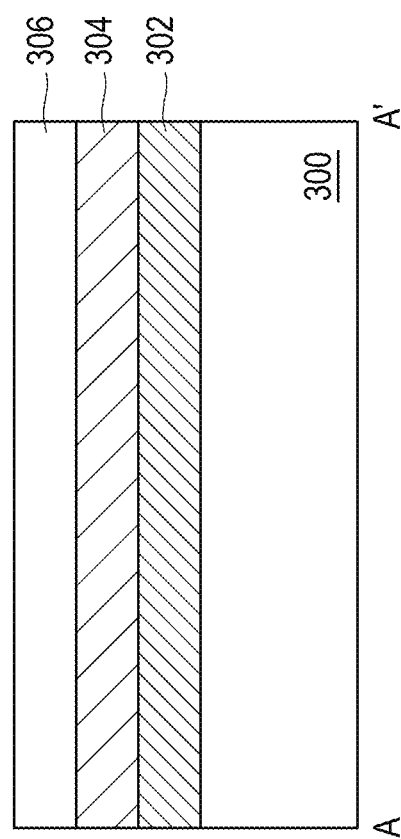
FIG. 4A through FIG. 4F are schematic cross-sectional views illustrating the intermediate structures at various stages during the manufacturing process shown in FIG. 2.
Figure 3A:
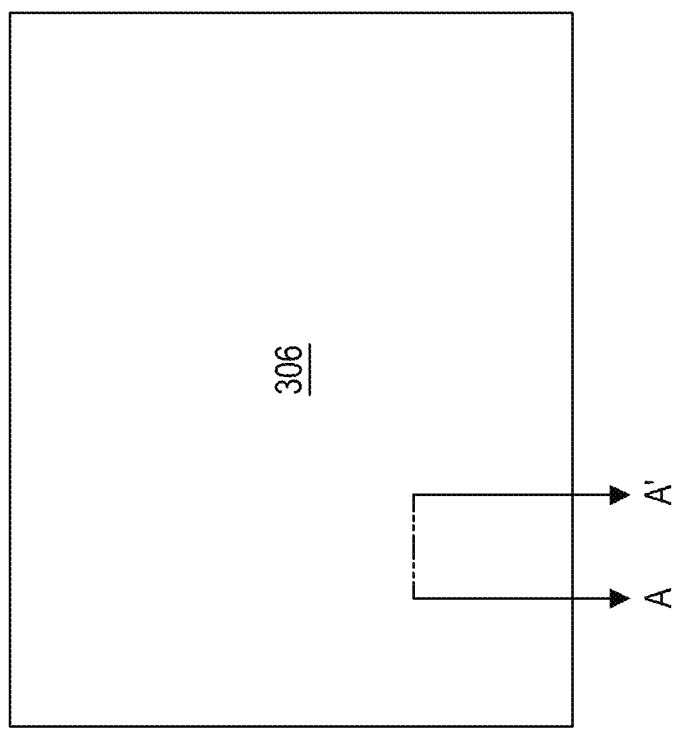
FIG. 3A through FIG. 3F are schematic plan views illustrating intermediate structures at various stages during the manufacturing process shown in FIG. 2.

Referring to FIG. 2, FIG. 3A and FIG. 4A, step S200 is performed, and a stacking structure including an antiferromagnetic material layer 302, a ferromagnetic material layer 304 and a mask layer 306 is formed on a substrate 300. The substrate 300 may be a semiconductor substrate, such as a silicon substrate. However, the present disclosure is not limited to a material of the substrate 300. In addition, material layer(s) (e.g., wiring layers) may be preliminarily formed on the substrate 300 before formation of the stacking structure. The antiferromagnetic material layer 302 will be patterned to form the antiferromagnetic layer 108b described with reference to FIG. 1C, and the ferromagnetic material layer 304 will be patterned to form the ferromagnetic layer 108a described with reference to FIG. 1C. According to some embodiments, a method for forming the antiferromagnetic material layer 302 and a method for forming the ferromagnetic material layer 304 respectively include a deposition process, such as a physical vapor deposition (PVD) process. Further, the mask layer 306 may be a photoresist layer. In some embodiments, the antiferromagnetic material layer 302, the ferromagnetic material layer 304 and the mask layer 306 are sequentially formed on the substrate 300.

Figure 4B:
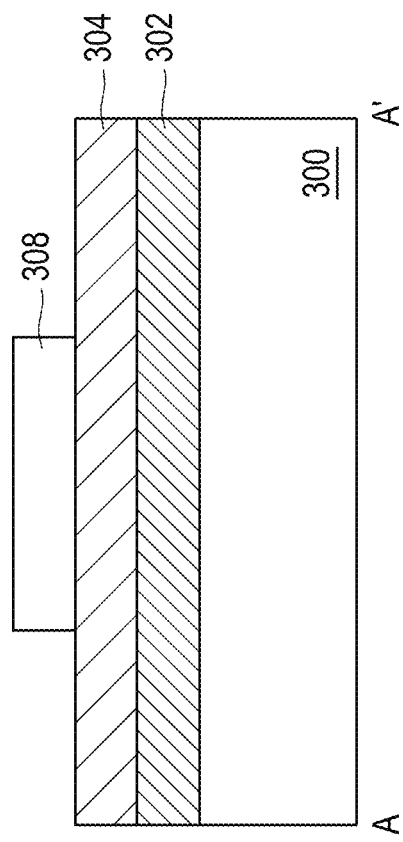
Figure 3B:
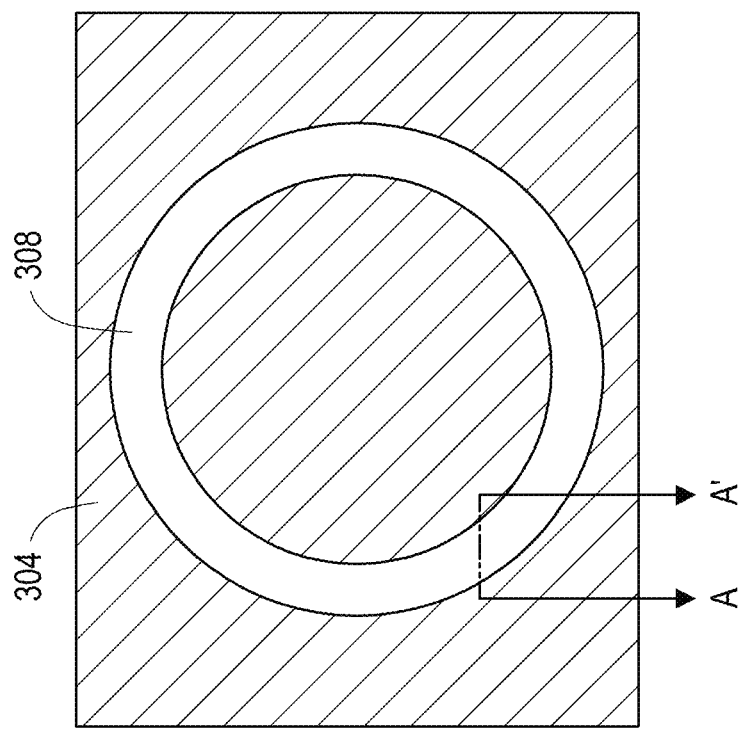

Referring to FIG. 2, FIG. 3B and FIG. 4B, step S202 is performed, and the mask layer 306 is patterned to form a mask pattern 308. The mask pattern 308 will be used as a shadow mask during a subsequent etching process for patterning the antiferromagnetic material layer 302 and the ferromagnetic material layer 304. In some embodiments, the mask pattern 308 is formed as a closed annulus pattern. In those embodiments where the mask layer 306 is a photoresist layer, a method for patterning the mask layer 306 to form the mask pattern 308 may include an exposure process and a development process.

Figure 4C:
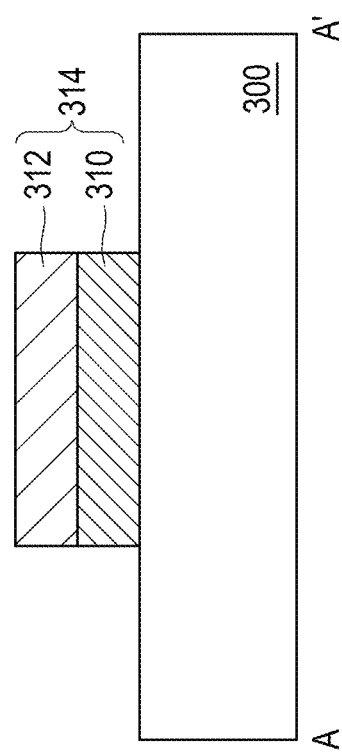
Figure 3C:
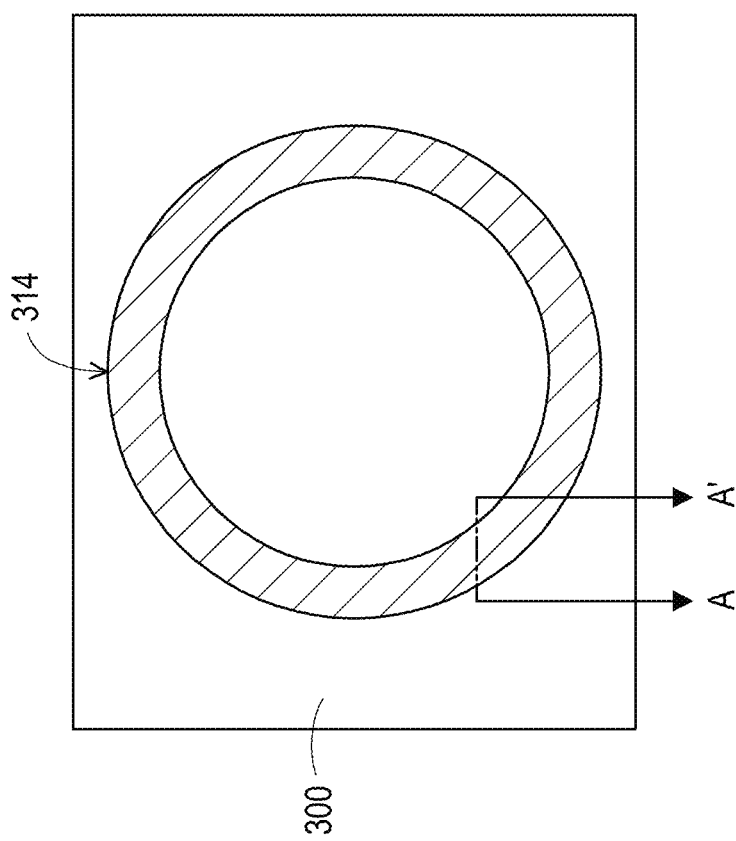

Referring to FIG. 2, FIG. 3C and FIG. 4C, step S204 is performed, and the antiferromagnetic material layer 302 and the ferromagnetic material layer 304 are patterned to form an initial antiferromagnetic layer 310 and an initial ferromagnetic layer 312, respectively. A stacking structure including the initial antiferromagnetic layer 310 and the initial ferromagnetic layer 312 may be referred to as an initial reference layer 314. In some embodiments, such patterning step is performed by using an etching process. During the etching process, the mask pattern 308 shown in FIG. 3B and FIG. 4B may be functioned as a shadow mask, for defining a boundary of the initial reference layer 314. In other words, in those embodiments where the mask pattern 308 is formed as a closed annulus pattern, the initial reference layer 314 is also formed as a closed annulus pattern. The mask pattern 308 may be removed after such patterning step by using a method such as a stripping process or an ashing process.

In the embodiments described above, the initial reference layer 314 is formed by patterning the antiferromagnetic material layer 302 and the ferromagnetic material layer 304 using a subtractive lithography process. However, in alternative embodiments, an additive lithography process may be used for patterning the antiferromagnetic material layer 302 and the ferromagnetic material layer 304 to form the initial reference layer 314. As an example, the additive lithography process may be a lift-off lithography process. In these alternative embodiments, a mask pattern may be formed on the substrate 300 before formation of the antiferromagnetic material layer 302 and the ferromagnetic material layer 304. After forming the antiferromagnetic material layer 302 and the ferromagnetic material layer 304, the mask pattern and a portion of the antiferromagnetic material layer 302 as well as a portion of the ferromagnetic material layer 304 overlying the mask pattern are lifted off from the substrate 300. Remained portion of the antiferromagnetic material layer 302 and remained portion of the ferromagnetic material layer 304 form the initial antiferromagnetic layer 310 and the initial ferromagnetic layer 312, respectively.

Figure 4D:
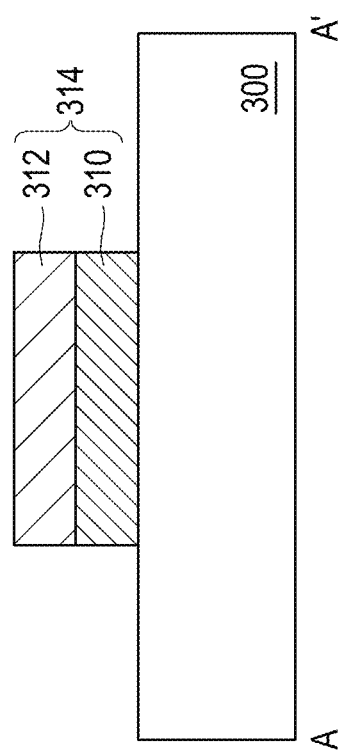
Figure 3D:
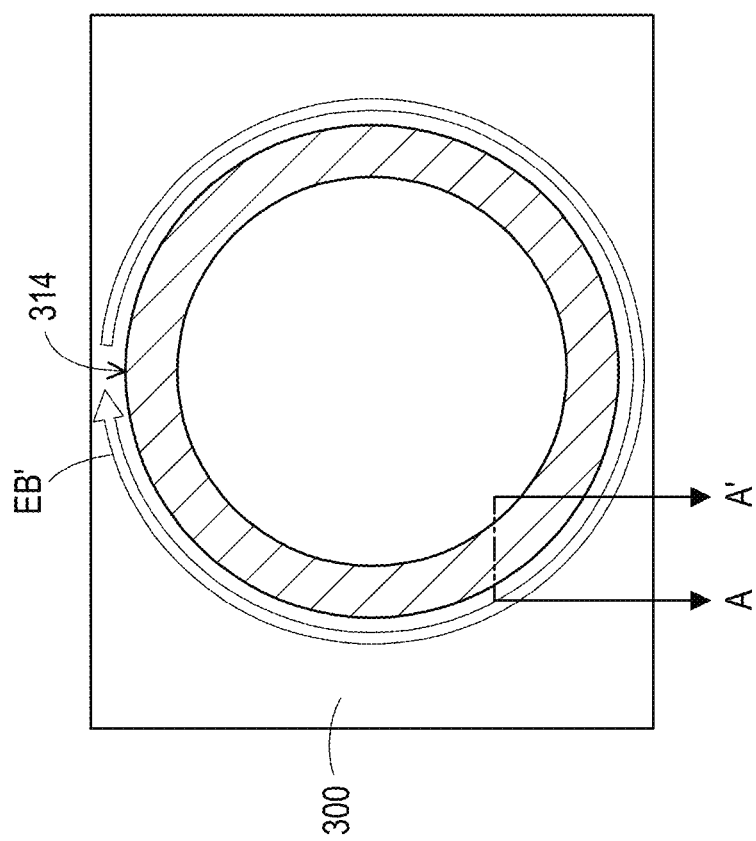

Referring to FIG. 2, FIG. 3D and FIG. 4D, step S206 is performed, and the initial reference layer 314 is subjected to a heat treatment. During the heat treatment, the initial reference layer 314 is entirely heated over a blocking temperature. When the temperature of the initial reference layer 314 is higher than the blocking temperature, the exchange bias coupling between the initial antiferromagnetic layer 310 and the initial ferromagnetic layer 312 may weaken or no longer exist. As being formed in an annular shape, the initial ferromagnetic layer 312 may be magnetized with a magnetization direction along a vortex path or a loop, for overcoming a demagnetizing energy. During a cooling step after the heating step, the temperature of the initial reference layer 314 falls below the blocking temperature. At this time, spin directions of a thin portion of the initial antiferromagnetic layer 310 closest to the initial ferromagnetic layer 312 are aligned with the magnetization direction of the initial ferromagnetic layer 312, which is oriented along a vortex path or a loop. As a result, an exchange bias oriented along an initial exchange bias coupling direction EB' following a vortex path or a loop is obtained. According to some embodiments, as shown in FIG. 3D, the initial exchange bias coupling direction EB' is clockwise. In alternative embodiments, the initial exchange bias coupling direction EB' is counterclockwise. Further, in some embodiments, an external magnetic field may be applied on the initial reference layer 314 during the cooling step of the heat treatment, for ensuring that the initial exchange bias coupling direction EB' obtained every time would be consistently clockwise or counterclockwise. In alternative embodiments, an external magnetic field may be absent during the cooling step of the heat treatment. Moreover, in some embodiments, a thickness of the initial ferromagnetic layer 312 has to be greater than a critical thickness of about 15 nm, for ensuring an exchange bias following a vortex path or a loop can be obtained. However, the critical thickness may vary according to dimension (e.g., thickness) and material selection of the initial reference layer 314, the present disclosure is not limited to the value of the critical thickness.

Figure 4E:
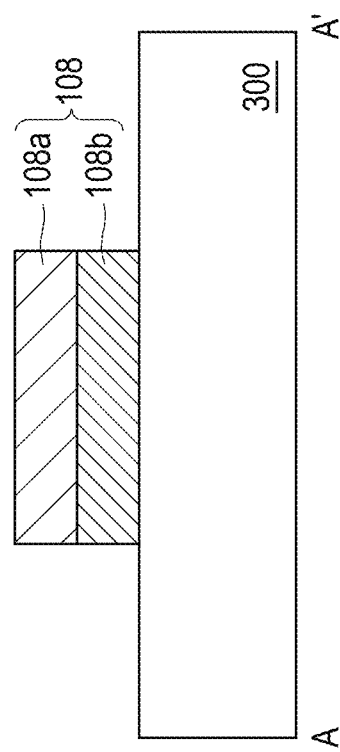
Figure 3E:
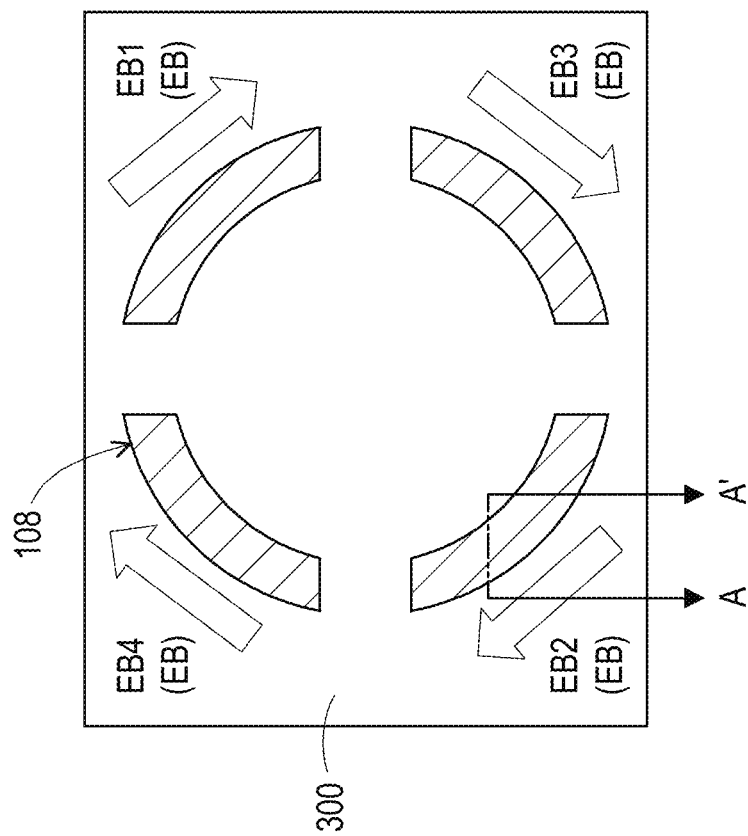

Referring to FIG. 2, FIG. 3E and FIG. 4E, step S208 is performed, and the initial reference layer 314 is patterned to form separate reference layers 108 each in an annular sector shape. In the current step, the initial antiferromagnetic layer 310 of the initial reference layer 314 is patterned to form antiferromagnetic layers 108b each in an annular sector shape, while the initial ferromagnetic layer 312 of the initial reference layer 314 is patterned to form ferromagnetic layers 108a each in an annular sector shape. A thickness of the antiferromagnetic layers 108b is substantially identical with the thickness of the initial antiferromagnetic layer 310, and the antiferromagnetic layers 108b are arranged along the annular boundary of the initial antiferromagnetic layer 310. Similarly, a thickness of the ferromagnetic layers 108a is substantially identical with the thickness of the initial ferromagnetic layer 312, and the ferromagnetic layers 108a are arranged along the annular boundary of the initial ferromagnetic layers 312. One of the antiferromagnetic layers 108b and the ferromagnetic layer 108a in contact with each other are collectively referred to as one of the reference layers 108. The reference layers 108 have exchange bias coupling directions EB along a vortex path or a loop, along which the initial exchange bias coupling direction EB' follows. For instance, four separate reference layers 108 are obtained from the current patterning step, and the four reference layers 108 have the first exchange bias coupling direction EB1, the second exchange bias coupling direction EB2, the third exchange bias coupling direction EB3 and the fourth exchange bias coupling direction EB4, respectively. In those embodiments where the initial exchange bias coupling direction EB' follows a clockwise vortex path or loop, the first through fourth exchange bias coupling directions EB1-EB4 may be arranged along this clockwise vortex path or loop. In other embodiments where the initial exchange bias coupling direction EB' follows a counterclockwise vortex path or loop, the first through fourth exchange bias coupling directions EB1-EB4 may be arranged along this counterclockwise vortex path or loop. Furthermore, in some embodiments, a method for patterning the initial reference layer 314 to form the reference layers 108 each in an annular sector shape includes a lithography process and an etching process.

Figure 4F:
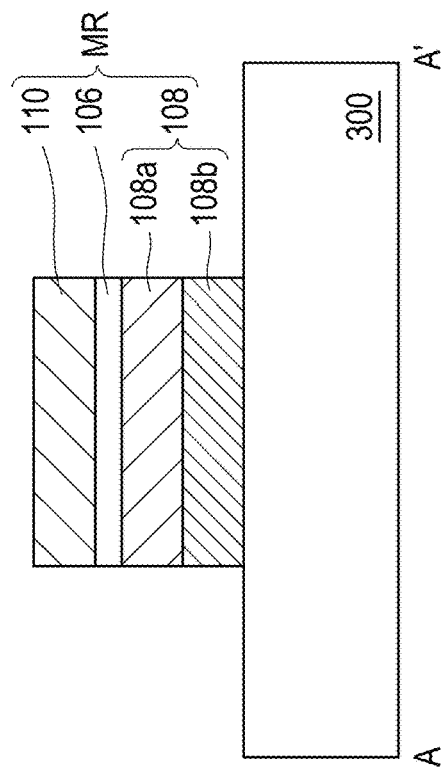
Figure 3F:
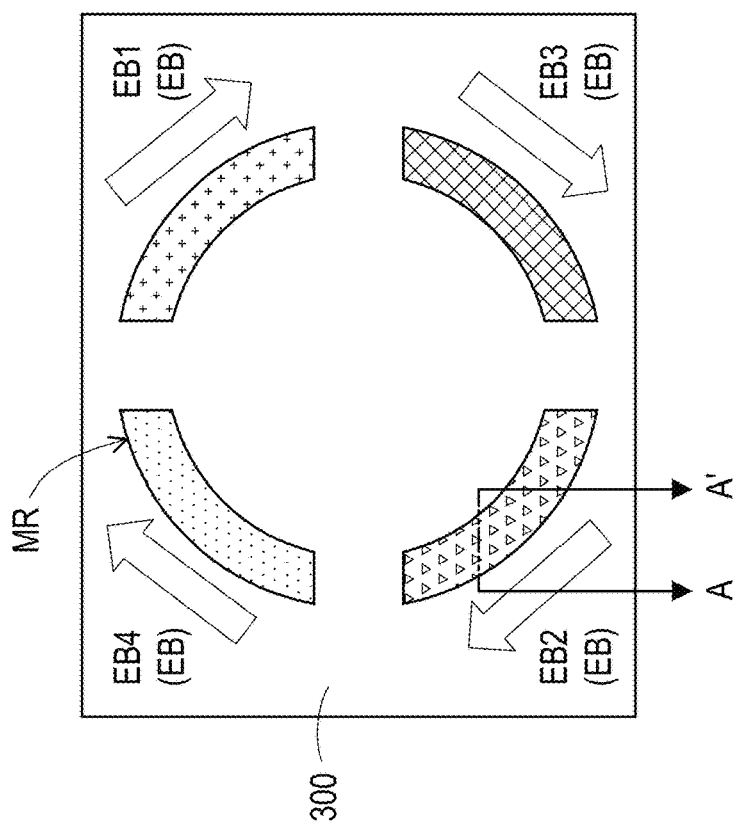

Referring to FIG. 2, FIG. 3F and FIG. 4F, step S210 is performed, and a spacer layer 106 as well as a free layer 110 are formed on each of the reference layer 108. The spacer layers 106 and the free layers 110 may be respectively formed in a shape identical with the shape of the underlying reference layers 108 (i.e., the annular sector shape), and may be substantially aligned with the underlying reference layers 108. In this way, the magnetoresistive devices MR each in an annular sector shape and include one of the reference layers 108, the free layer 110 overlapped with this reference layer 108 and the spacer layer 106 lying between this reference layer 108 and this free layer 110. The reference layers 108 have different exchange bias coupling directions EB, thus the magnetoresistive devices MR have different phases. According to some embodiments, a method for forming the spacer layers 106 and the free layers 110 includes globally forming material layers, and patterning these material layers to form the spacer layers 106 and the free layers 110 by a lithography process and at least one etching process.

Up to here, the magnetoresistive devices MR have been formed on the substrate 300. The magnetoresistive devices MR are arranged along a single annular path, and have different phases. For instance, four magnetoresistive devices MR having different phases are arranged along a single annular path. However, although not shown, more magnetoresistive devices MR arranged along multiple annular shapes can be simultaneously formed on the substrate 300. Further, the magnetoresistive devices MR may be routed and interconnected to form the magnetoresistive sensor 100 including the wheatstone bridges 102, 104, as shown in FIG. 1A.

In alternative embodiments where the free layer 110 is located below the spacer layer 106 and the reference layer 108 lies above the spacer layer 106, an initial free layer and an initial spacer layer may be globally formed on the substrate 300 before the step S200 described with reference to FIG. 3A and FIG. 4A, and the initial free layer and the initial spacer layer are pattered to form separate free layers and separate spacer layers during the step S204 described with reference to FIG. 3C and FIG. 4C. In addition, the step S210 described with reference to FIG. 3F and FIG. 4F may be omitted.

As described above, the magnetoresistive devices MR having different phases can be formed by a manufacturing process including a single heat treatment step. Therefore, manufacturing of the magnetoresistive sensor including the magnetoresistive devices MR having different phases (e.g., the magnetoresistive sensor 100) can be significantly simplified.

Figure 5B:
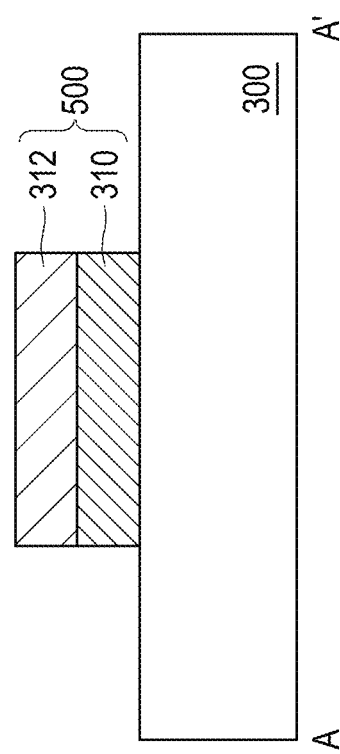
FIG. 5B is a schematic cross-sectional view along an A-A' line shown in FIG. 5A.
Figure 5A:
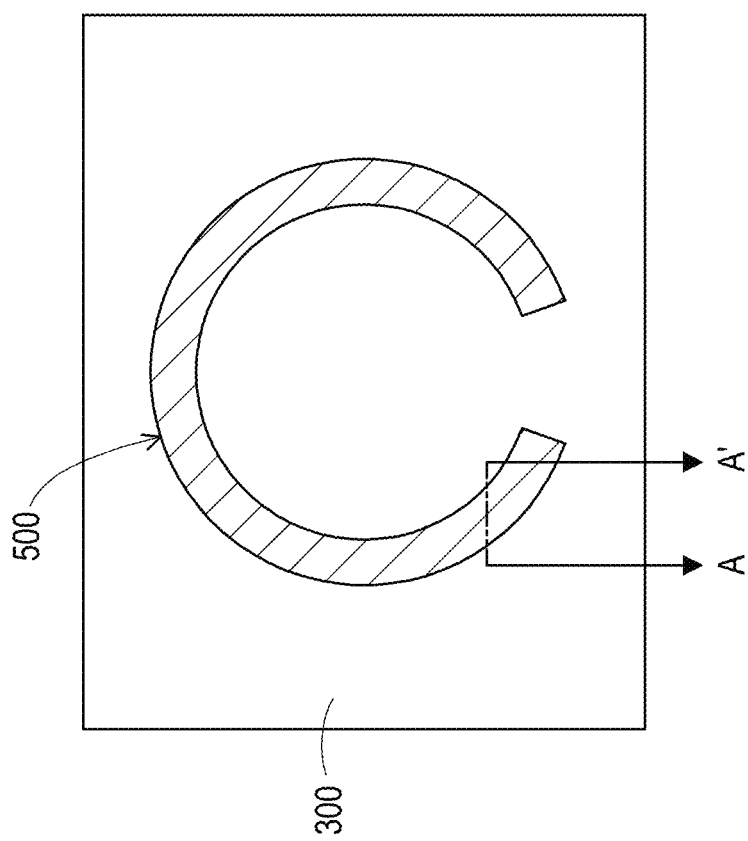
FIG. 5A is a schematic plan view illustrating a test device formed on a substrate.

A test structure will be used for verification. FIG. 5A is a schematic plan view illustrating a test device 500 formed on the substrate 300. FIG. 5B is a schematic cross-sectional view along an A-A' line shown in FIG. 5A. FIG. 5C and FIG. 5D are images taken on the test structure 500 by a magnetic force microscopy (MFM).

Referring to FIG. 5A and FIG. 5B, a test structure 500 including an initial reference layer is measured to verify if the initial reference layer 314 could have the initial exchange bias coupling direction EB' as shown in FIG. 3D and FIG. 4D. The test structure is similar to the initial reference layer 314 as shown in FIG. 3D and FIG. 4D in terms of structure (stacking, thickness and so forth), but is formed as an open annulus pattern rather than a closed annulus pattern. For instance, as shown in FIG. 5A, the test structure 500 including the initial antiferromagnetic layer 310 and the initial ferromagnetic layer 312 may be formed as a C-shaped annulus pattern. If the test structure 500 was formed as a closed annulus pattern, a stray field may be absent, thus the exchange bias coupling direction of the test structure 500 may be difficult to be observed by MFM. In other words, the test structure 500 formed as an open annulus pattern can have stray field, thus the exchange bias coupling direction of the test structure 500 can be observed by MFM, and the initial exchange bias coupling direction EB' of the initial reference layer 314 as shown in FIG. 3D and FIG. 4D can be verified.

A first external magnetic field is applied to the test structure 500 until magnetic saturation is reached, then the first external magnetic field is removed and the test structure 500 is observed by MFM. The result is shown in FIG. 5C. As shown in FIG. 5C, a bright region BR1 and a dark region DR1 are located at two end portions EP1, EP2 of the test structure 500, respectively. In addition, an apparent bright/dark contrast is absent along a connecting portion CN1 extending between the end portions EP1, EP2 of the test structure 500. This indicates that the magnetization direction of the ferromagnetic layer in the test structure 500 (i.e., the initial ferromagnetic layer 312) resulted from the first external magnetic field is directed from the end portion EP1 toward the end portion EP2 along the connecting portion CN1. Therefore, the magnetization direction of the test structure 500 in corresponding to the first external magnetic field follows a vortex path or a loop.

In addition, a second external magnetic field opposite to the first external magnetic field is applied to the test structure 500 until magnetic saturation is reached, then the second external magnetic field is removed and the test structure 500 is observed by MFM. The result is shown in FIG. 5D. As shown in FIG. 5D, a bright region BR2 and a dark region DR2 are located at two end portions EP1, EP2 of the test structure 500. In addition, an apparent bright/dark contrast is absent along the connecting portion CN1 extending between the end portions EP1, EP2 of the test structure 500. As opposite to the result shown in FIG. 5C, FIG. 5D shows that the bright region BR2 is located at the end portion EP1 and the dark region DR2 is located at the end portion EP2. Since a probe of the MFM is magnetized along with the test structure 500 by the first and second external magnetic fields opposite to each other, the opposite results shown in FIG. 5C and FIG. 5D (as indicated by the arrows along the connecting portion CN1 as shown in FIG. 5C and FIG. 5D) indicate that the magnetization direction of the ferromagnetic layer remains unchanged when subjected to opposite external magnetic fields. This proves establishment of exchange bias. Further, a direction of the exchange bias (i.e., the exchange bias coupling direction described in the present disclosure) follows the connecting portion CN1 as a part of a vortex path or a loop along.

Figure 6A:
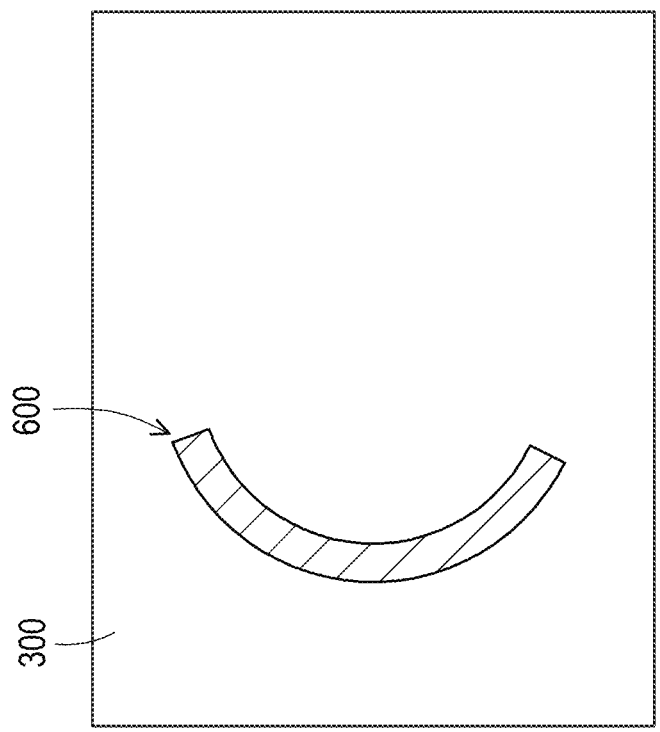
FIG. 6A is a schematic plan view illustrating an annular sector test structure located on a substrate.
Figure 6C:
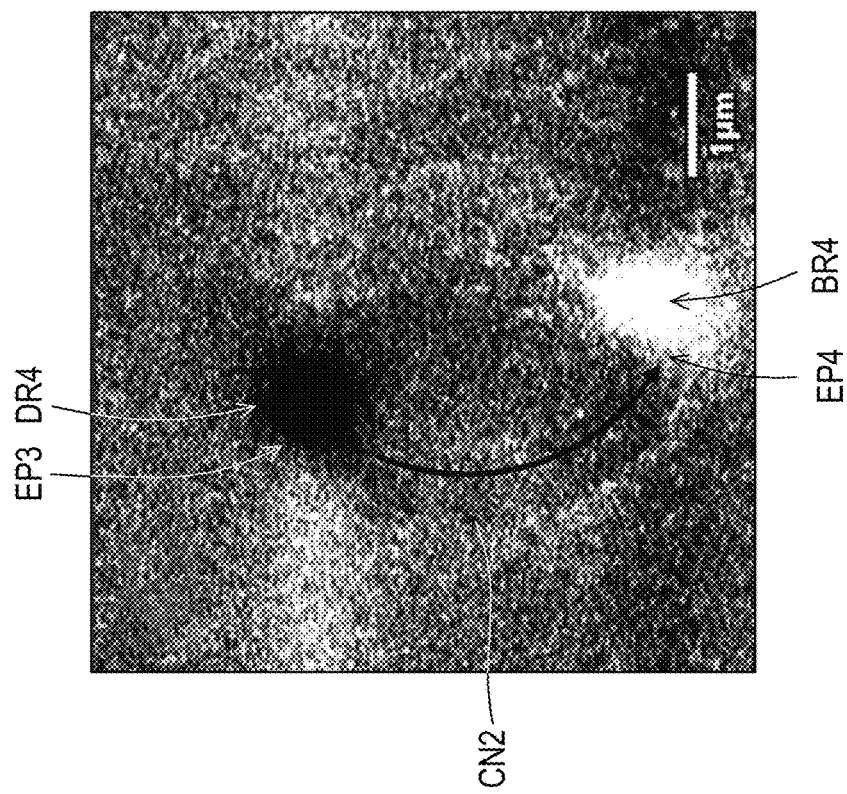
FIG. 6B and FIG. 6C are images taken on the annular sector test structure by an MFM.
Figure 6B:
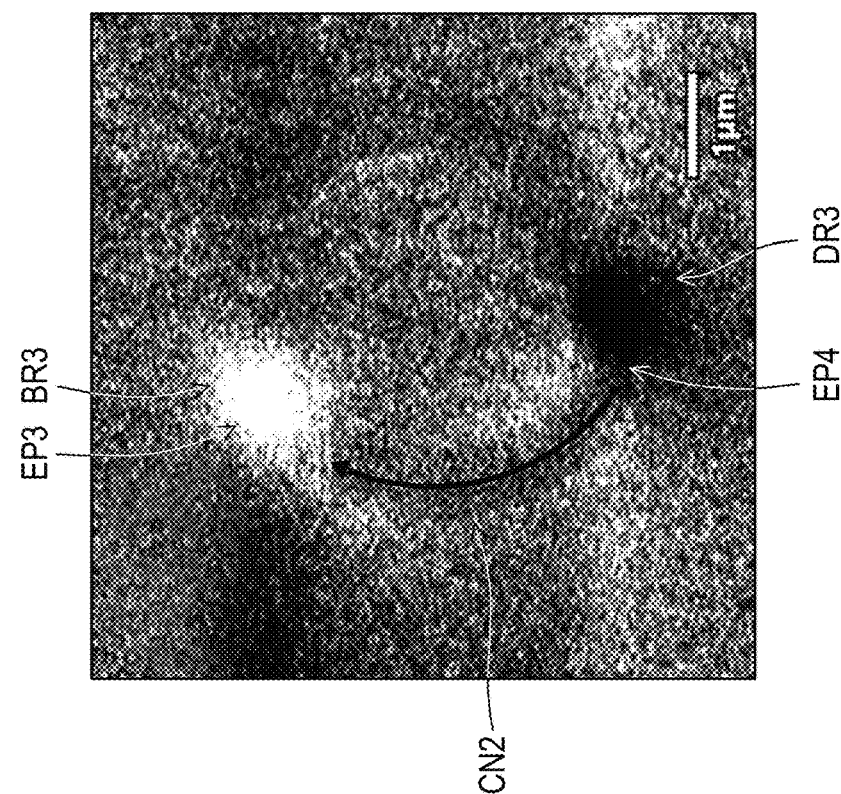

Furthermore, the test structure 500 is patterned to form a test structure in an annular sector shape, and the test structure in annular sector shape is measured by MFM. FIG. 6A is a schematic plan view illustrating a test structure 600 in annular sector shape and located on the substrate 300. FIG. 6B and FIG. 6C are images taken on the test structure 600 in annular sector shape by MFM.

Referring to FIG. 6A, the test structure 600 in annular sector shape is obtained by patterning the test structure 500 formed as an open annulus pattern (shown in FIG. 5A and FIG. 5B). Therefore, the test structure 600 still extend along a vortex path or a loop followed by the test structure 500, and a central angle of the test structure 600 in annular sector shape should be less than a central angle of the test structure 500 as an open annulus pattern.

A first external magnetic field is applied to the test structure 600 until magnetic saturation is reached, then the first external magnetic field is removed and the test structure 600 is observed by MFM. The result is shown in FIG. 6B. In addition, a second external magnetic field opposite to the first external magnetic field is applied to the test structure 600 until magnetic saturation is reached, then the second external magnetic field is removed and the test structure 600 is observed by MFM. The result is shown in FIG. 6C. Referring to FIG. 6B and FIG. 6C, the test structure 600 in annular sector shape has an end portion EP3 and an end portion EP4. According to the result shown in FIG. 6B, a bright region BR3 is located at the end portion EP3, while a dark region DR3 is located at the end portion EP4. On the other hand, in the result shown in FIG. 6C, a dark region DR4 is located at the end portion EP3, while a bright region BR4 is located at the end portion BR4. Since a probe of the MFM is magnetized along with the test structure 600 by the first and second external magnetic fields opposite to each other, the opposite results shown in FIG. 6B and FIG. 6C (as indicated by the arrows along a connecting portion CN2 extending between the end portions EP3, EP4 as shown in FIG. 6B and FIG. 6C) indicates that the magnetization direction of the ferromagnetic layer remain unchanged when subjected to opposite external magnetic fields. This proves establishment of exchange bias. Further, a direction of the exchange bias (i.e., the exchange bias coupling direction described in the present disclosure) still follows a vortex path or a loop.

The results shown in FIG. 6B and FIG. 6C proves that the reference layers 108 separated from the initial reference layer 314 (as shown in FIG. 3E and FIG. 4E) have exchange bias coupling directions EB following an extending path of the initial reference layer 314. In other words, by forming an initial reference layer with an initial exchange bias coupling direction following a vortex path or a loop and patterning this initial reference layer to form separate portions, reference layers with different exchange bias coupling directions can be simply manufactured. Subsequently, these reference layers may be subjected to further processes for forming magnetoresistive devices with different phases.

Moreover, the results also indicate that the initial reference layer is not limited to a closed annulus pattern. In alternative embodiments, the reference layers each in annular sector shape can be formed by patterning an initial reference layer as an open annulus pattern, and these reference layers may be subjected to further processes for forming magnetoresistive devices with different phases. In some embodiments, a central angle of the initial reference layer formed as an open annulus pattern is sufficiently large, such that the initial reference layer can be patterned to form a sufficient amount of the reference layers with different exchange bias coupling directions. As an example, the central angle of the initial reference layer formed as an open annulus pattern may be greater than about 180°.

In addition, more results show that initial reference layers formed as other open/closed annulus patterns also have exchange bias coupling directions respectively following a vortex path or a loop, and can be patterned to form separate reference layers with different exchange bias coupling directions. The reference layers may be subjected to further processes for forming magnetoresistive devices with different phases, and are applicable to a magnetoresistive sensor requiring magnetoresistive devices having different phases. For instance, the open/closed annulus pattern of the initial reference layer may include a triangular annulus pattern, a rectangular annulus pattern, a polygonal annulus pattern, an elliptical annulus pattern or so forth, and the reference layers separated from these initial reference layer may respectively have a curved shape, or an annular sector shape with one or more corners.

As above, a manufacturing method for forming magnetoresistive devices having different phases is provided. The method includes forming an initial reference layer as an open/close annulus pattern. By performing a heat treatment on the initial reference layer, the initial reference layer can have an exchange bias oriented along a vortex path or a loop. In a subsequent process step, the initial reference layer is patterned to form separate reference layers. Exchange bias coupling directions of these reference layers are arranged along the vortex path or loop, and are different from one another. Further, these reference layers may be subjected to further processes for forming magnetoresistive devices with different phases. As comparing to other processes using multiple local heat treatments or multiple field depositions, the method for forming the magnetoresistive devices having different phases according to various embodiments of the present disclosure requires only a single global heat treatment, thus process complexity can be significantly reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a magnetoresistive sensor, comprising:

forming an initial reference layer in an annular shape, wherein the initial reference layer includes an antiferromagnetic layer with only a single side in contact with a ferromagnetic layer;

subjecting the initial reference layer to a heat treatment, wherein the ferromagnetic layer is magnetized and has a magnetization direction oriented along a vortex path during a heating step of the heat treatment, and an exchange bias oriented along the vortex path is generated at an interface between the antiferromagnetic layer and the ferromagnetic layer during a cooling step of the heat treatment;

patterning the initial reference layer to form separate reference layers, wherein the reference layers are respectively in an annular sector shape, and the reference layers are arranged along the vortex path;

forming spacer layers and free layers, to form magnetoresistive devices, wherein the magnetoresistive devices respectively comprise one of the reference layers and one of the free layers separated from each other by one of the spacer layers; and routing the magnetoresistive device to form the magnetoresistive sensor, wherein the initial reference layer is not applied with an external magnetic field in the cooling step during the heat treatment, wherein the spacer layers and the free layers are formed after formation of the reference layers.

2. The manufacturing method of the magnetoresistive sensor according to claim 1, wherein the initial reference layer is formed as a closed annulus pattern.

3. The manufacturing method of the magnetoresistive sensor according to claim 1, wherein the initial reference layer is formed as an open annulus pattern.

4. The manufacturing method of the magnetoresistive sensor according to claim 1, wherein the initial reference layer is formed as a circular annulus pattern or a polygonal annulus pattern.

5. The manufacturing method of the magnetoresistive sensor according to claim 1, wherein different exchange biases of the reference layers follow the vortex path.

* * * * *